United States Patent
Li et al.

(10) Patent No.: US 8,823,403 B2
(45) Date of Patent: Sep. 2, 2014

(54) LOAD CIRCUIT FOR TESTING USB PORTS

(75) Inventors: Zhen-Sen Li, Shenzhen (CN); Jian-She Shen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 224 days.

(21) Appl. No.: 13/552,574

(22) Filed: Jul. 18, 2012

(65) Prior Publication Data

US 2013/0222000 A1    Aug. 29, 2013

(30) Foreign Application Priority Data

Feb. 27, 2012    (CN) ............... 2012 1 0045051

(51) Int. Cl.
*G01R 31/04* (2006.01)
*G06F 3/00* (2006.01)
*G06F 13/20* (2006.01)
*G01R 1/28* (2006.01)
*G06F 11/22* (2006.01)
*G01R 31/30* (2006.01)

(52) U.S. Cl.
CPC ............... *G01R 1/28* (2013.01); *G06F 11/221* (2013.01); *G01R 31/30* (2013.01)
USPC ......... 324/750.01; 324/538; 710/15; 710/313

(58) Field of Classification Search
CPC ......... G01R 1/28; G01R 31/30; G06F 11/221
USPC ........ 324/538, 750.01; 710/15, 313; 327/530, 327/538, 108, 427, 540, 542
See application file for complete search history.

(56) References Cited

U.S. PATENT DOCUMENTS

2010/0141266 A1*    6/2010    Cui et al. .................. 324/538

* cited by examiner

*Primary Examiner* — Melissa Koval
*Assistant Examiner* — Farhana Hoque
(74) *Attorney, Agent, or Firm* — Novak Druce Connolly Bove + Quigg LLP

(57) ABSTRACT

An exemplary load circuit includes a switch unit and a current dividing circuit. The switch unit includes a number of switches. The current dividing circuit includes a number of sub-circuits. A terminal of a resistance module of each of the sub-circuits is connected to both a power terminal and a terminal of a corresponding one of the switches. The other terminal of the resistance module of each of the sub-circuits is connected to a drain of a transistor of each of the sub-circuits. A source of the transistor is connected to ground. A gate of the transistor is connected to ground, and is also connected to another terminal of the corresponding switch.

13 Claims, 7 Drawing Sheets

LOAD CIRCUIT FOR TESTING USB PORTS

BACKGROUND

1. Technical Field

The disclosure generally relates to load circuits, and particularly to a load circuit for testing Universal Serial Bus (USB) ports.

2. Description of the Related Art

USB ports include four different kinds, namely type 1.0, type 1.1, type 2.0, and type 3.0. For testing a performance of the various USB ports, many different standard load currents are needed. Typically, any one load circuit used in such testing can only simulate one standard load current. As a result, different load circuits must be provided for different kinds of USB ports, which is inconvenient and costly.

Therefore, there is room for improvement within the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several diagrams. Wherever possible, the same reference numbers are used throughout the drawings to refer to the same or like elements of an embodiment.

DETAILED DESCRIPTION

Figure 1:
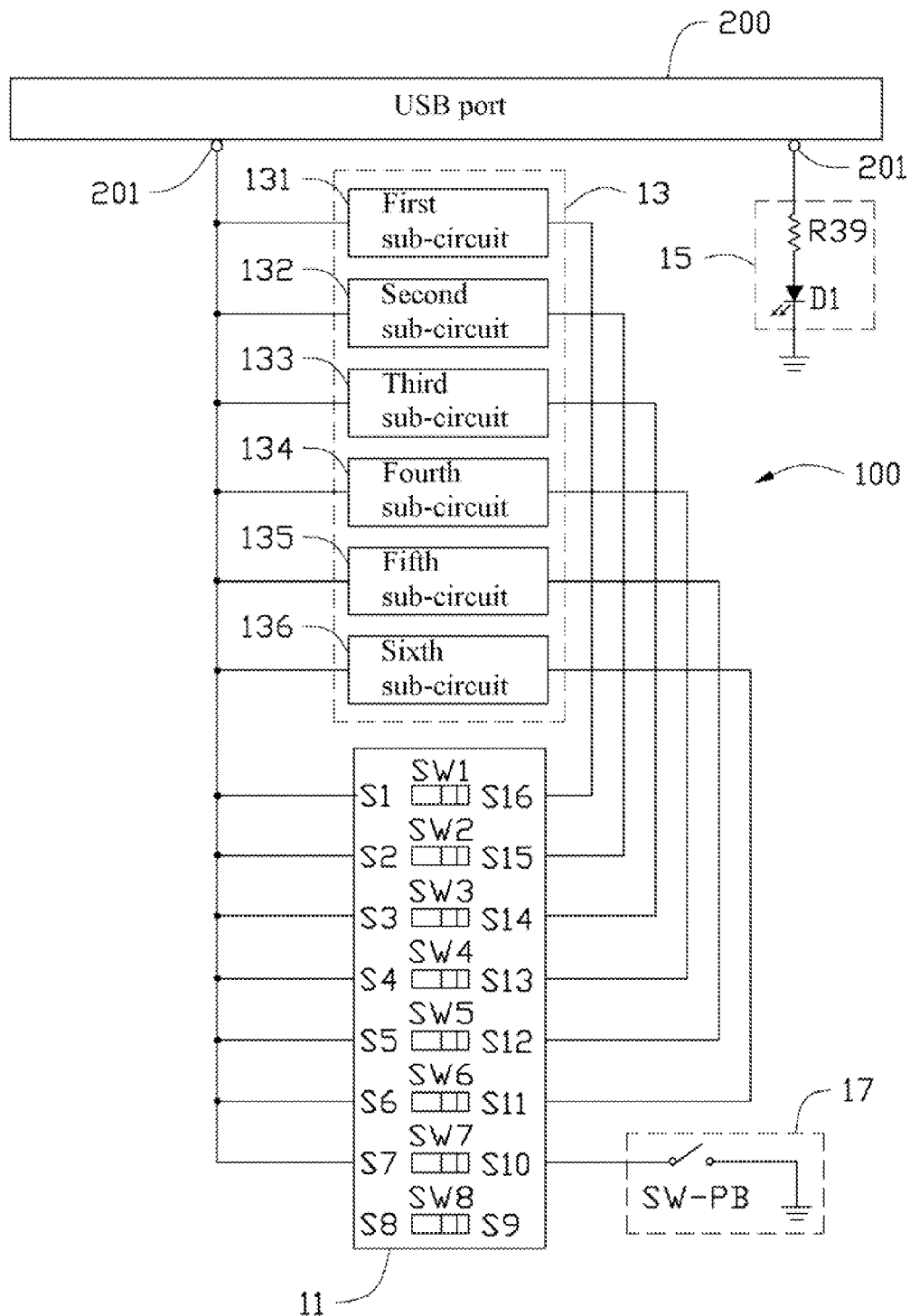
FIG. 1 is a circuit diagram of a load circuit used for testing USB ports, according to an exemplary embodiment.

FIG. 1 is a circuit diagram of a load circuit 100, according to an exemplary embodiment. The load circuit 100 is configured for simulating different standard load currents for a USB port 200 when the USB port 200 is under test, or for two USB ports 200 when the USB ports 200 are under test. Each USB port 200 can be 1.0 type, 1.1 type, 2.0 type or 3.0 type, and includes a power terminal 201. In FIG. 1, for simplicity, only one USB port 200 is illustrated. In this embodiment, the voltage value provided by the power terminal 210 is +5V (volts). The load circuit 100 includes a switch unit 11 and a current dividing circuit 13.

The switch unit 11 is a toggle switch, and includes first to sixteenth terminals, which are separately labeled as S1-S16. In this embodiment, the first terminal 51 can be electronically connected to and disconnected from the sixteenth terminal S16 by pushing a corresponding one of eight shift bars (not labeled) of the switch unit 11, thereby providing a first switch SW1. The second terminal S2 can be electronically connected to and disconnected from the fifteenth terminal S15 by pushing a corresponding one of the shift bars, thereby providing a second switch SW2. The third terminal S3 can be electronically connected to and disconnected from the fourteenth terminal S14 by pushing a corresponding one of the shift bars, thereby providing a third switch SW3. The fourth terminal S4 can be electronically connected to and disconnected from the thirteenth terminal S13 by pushing a corresponding one of the shift bars, thereby providing a fourth switch SW4. The fifth terminal S5 can be electronically connected to and disconnected from the twelfth terminal S12 by pushing a corresponding one of the shift bars, thereby providing a fifth switch SW5. The sixth terminal S6 can be electronically connected to and disconnected from the eleventh terminal S11 by pushing a corresponding one of the shift bars, thereby providing a sixth switch SW6. The seventh terminal S7 can be electronically connected to and disconnected from the tenth terminal S10 by pushing a corresponding one of the shift bars, thereby providing a seventh switch SW7. The eighth terminal S8 can be electronically connected to and disconnected from the ninth terminal S9 by pushing a corresponding one of the shift bars, thereby providing an eighth switch SW8. In this embodiment, the eighth switch SW8 is idle.

The current dividing circuit 13 includes a first sub-circuit 131, a second sub-circuit 132, a third sub-circuit 133, a fourth sub-circuit 134, a fifth sub-circuit 135, and a sixth sub-circuit 136.

Figure 2:
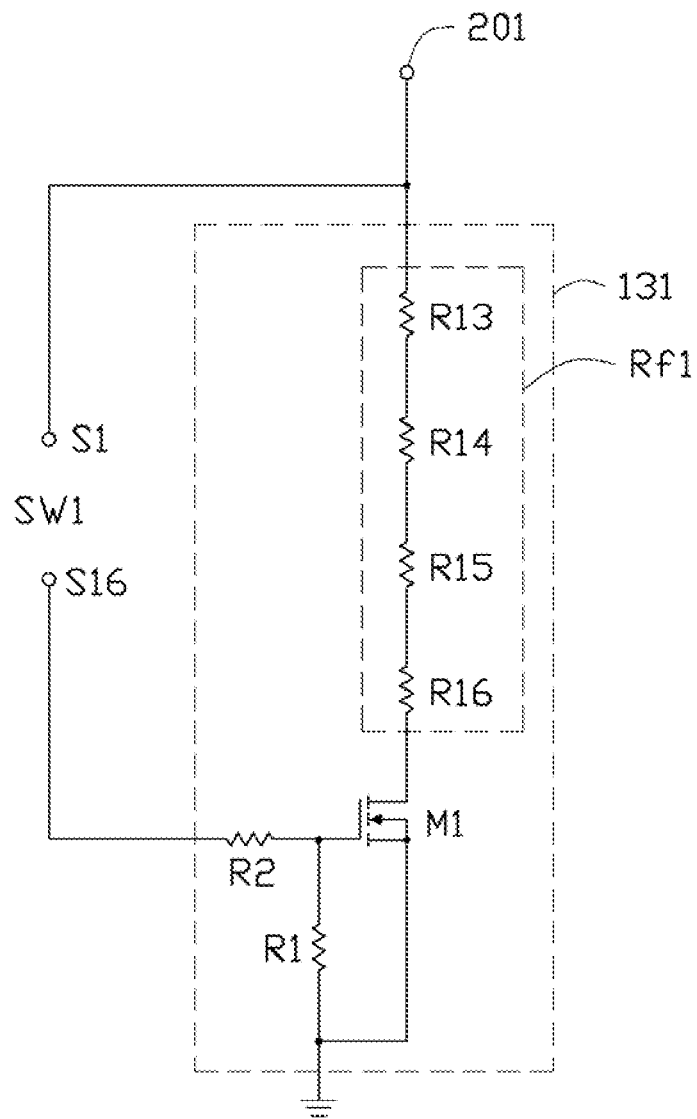
FIG. 2 is a circuit diagram of a first sub-circuit of the load circuit shown in FIG. 1, together with circuitry of the load circuit associated with the first sub-circuit.

Referring to FIG. 2, the first sub-circuit 131 includes a first resistance module Rf1, a first transistor M1, and resistors R1, R2. A terminal of the first resistance module Rf1 is connected to both the power terminal 201 and a terminal of the first switch SW1 (e.g., the first terminal S1). The other terminal of the first resistance module Rf1 is connected to a drain of the first transistor M1. A source of the first transistor M1 is connected to ground. A gate of the first transistor M1 is connected to ground via the resistor R1, and is also connected to the other terminal of the first switch SW1 (e.g., the sixteenth terminal S16) through the resistor R2.

Figure 3:
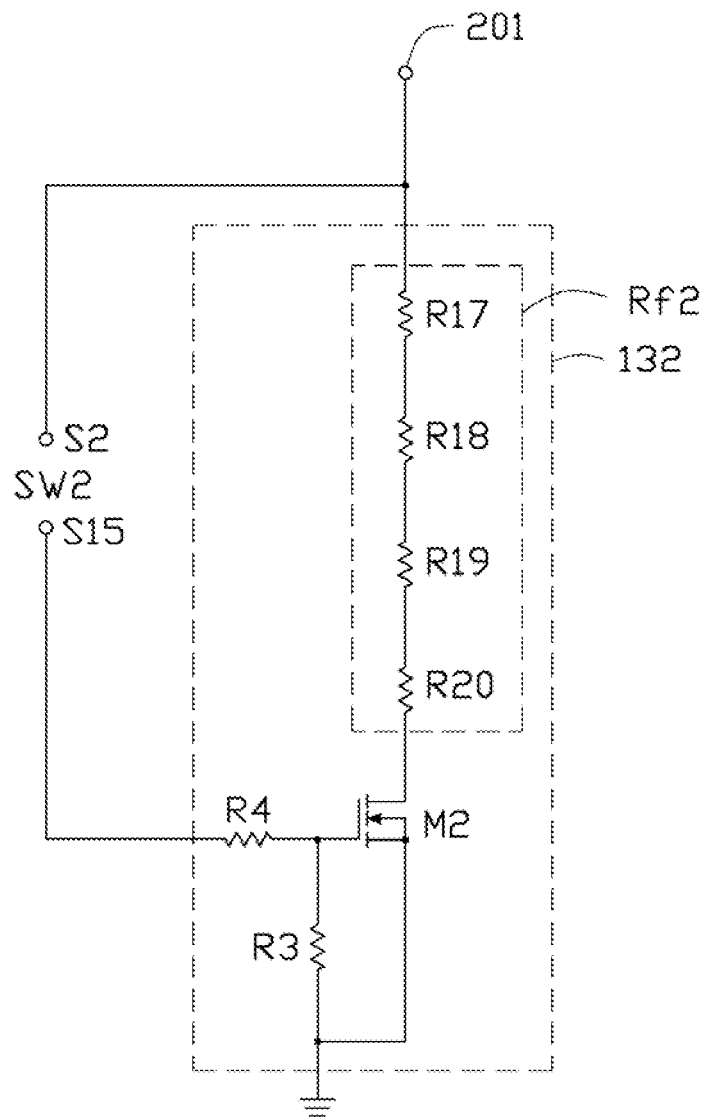
FIG. 3 is a circuit diagram of a second sub-circuit of the load circuit shown in FIG. 1, together with circuitry of the load circuit associated with the second sub-circuit.

Referring to FIG. 3, the second sub-circuit 132 includes a second resistance module Rf2, a second transistor M2, and resistors R3, R4. A terminal of the second resistance module Rf2 is connected to both the power terminal 201 and a terminal of the second switch SW2 (e.g., the second terminal S2). The other terminal of the second resistance module Rf2 is connected to a drain of the second transistor M2. A source of the second transistor M2 is connected to ground. A gate of the second transistor M2 is connected to ground via the resistor R3, and is also connected to the other terminal of the second switch SW2 (e.g., the fifteenth terminal S15) through the resistor R4.

Figure 4:
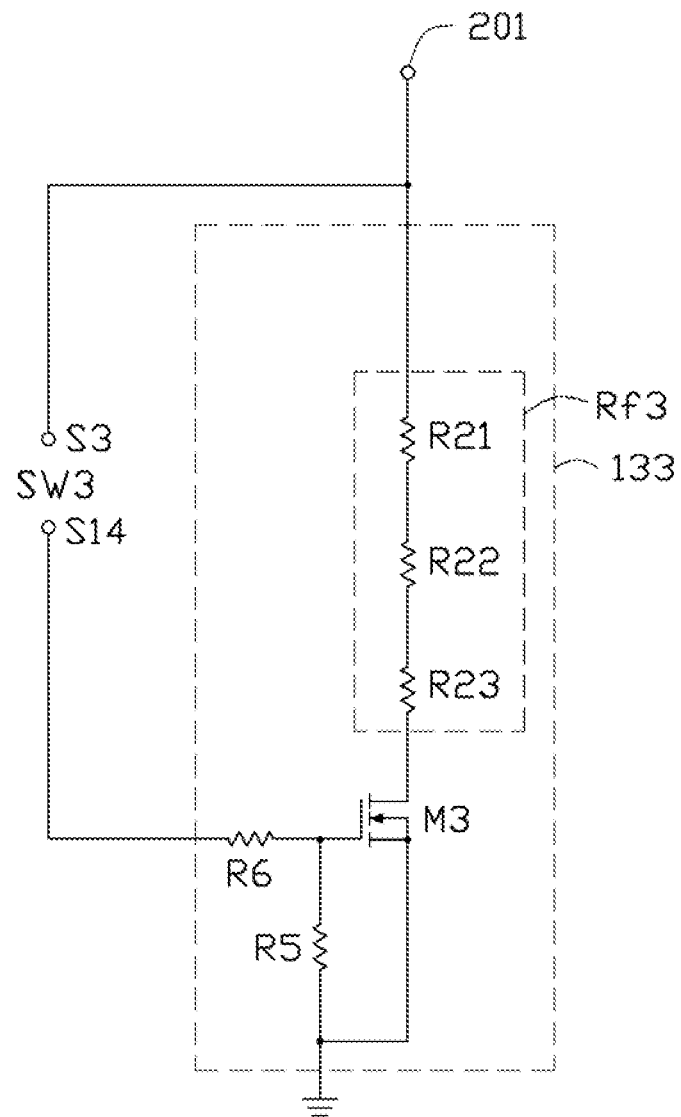
FIG. 4 is a circuit diagram of a third sub-circuit of the load circuit shown in FIG. 1, together with circuitry of the load circuit associated with the third sub-circuit.

Referring to FIG. 4, the third sub-circuit 133 includes a third resistance module Rf3, a third transistor M3, and resistors R5, R6. A terminal of the third resistance module Rf3 is connected to both the power terminal 201 and a terminal of the third switch SW3 (e.g., the third terminal S3). The other terminal of the third resistance module Rf3 is connected to a drain of the third transistor M3. A source of the third transistor M3 is connected to ground. A gate of the third transistor M3 is connected to ground via the resistor R5, and is also connected to the other terminal of the third switch SW3 (e.g., the fourteenth terminal S14) through the resistor R6.

Figure 5:
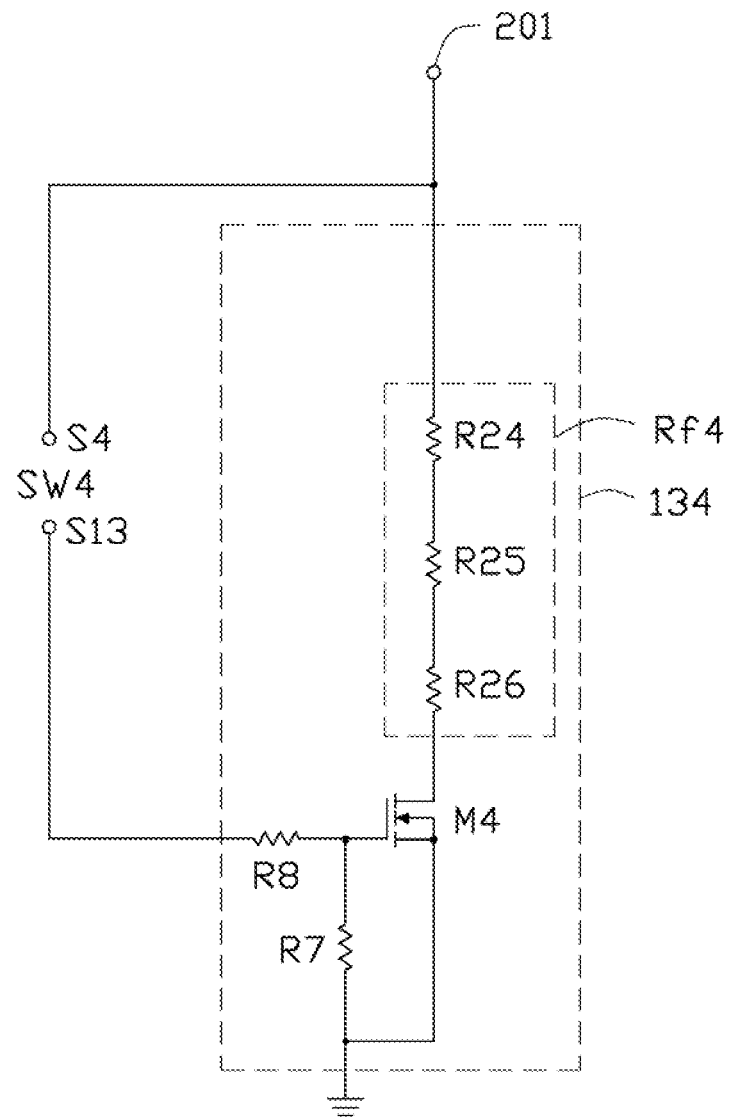
FIG. 5 is a circuit diagram of a fourth sub-circuit of the load circuit shown in FIG. 1, together with circuitry of the load circuit associated with the fourth sub-circuit.

Referring to FIG. 5, the fourth sub-circuit 134 includes a fourth resistance module Rf4, a fourth transistor M4, and resistors R7, R8. A terminal of the fourth resistance module Rf4 is connected to both the power terminal 201 and a terminal of the fourth switch SW4 (e.g., the fourth terminal S4). The other terminal of the fourth resistance module Rf4 is connected to a drain of the fourth transistor M4. A source of the fourth transistor M4 is connected to ground. A gate of the fourth transistor M4 is connected to ground via the resistor R7, and is also connected to the other terminal of the fourth switch SW4 (e.g., the thirteenth terminal S13) through the resistor R8.

Figure 6:
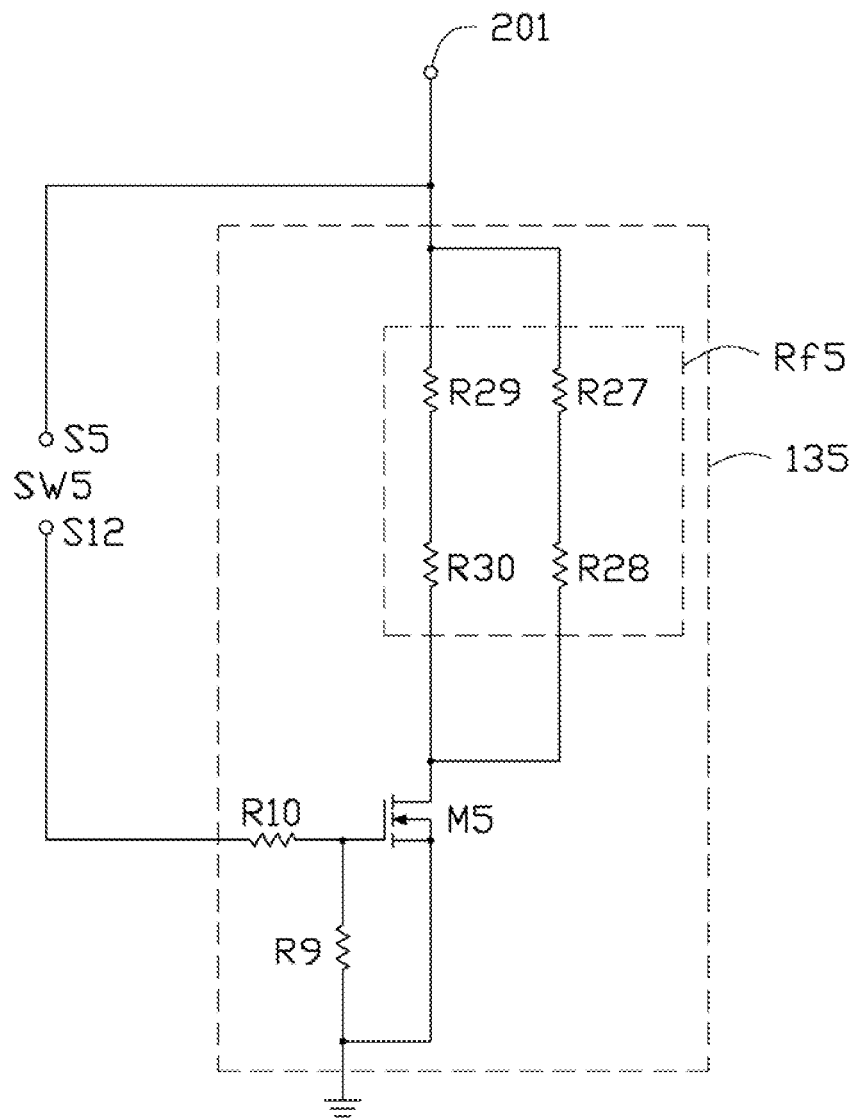
FIG. 6 is a circuit diagram of a fifth sub-circuit of the load circuit shown in FIG. 1, together with circuitry of the load circuit associated with the fifth sub-circuit.

Referring to FIG. 6, the fifth sub-circuit 135 includes a fifth resistance module Rf5, a fifth transistor M5, and resistors R9, R10. A terminal of the fifth resistance module Rf5 is connected to both the power terminal 201 and a terminal of the fifth switch SW5 (e.g., the fifth terminal S5). The other terminal of the fifth resistance module Rf5 is connected to a drain of the fifth transistor M5. A source of the fifth transistor M5 is connected to ground. A gate of the fifth transistor M5 is connected to ground via the resistor R9, and is also connected to the other terminal of the fifth switch SW5 (e.g., the twelfth terminal 12) through the resistor R10.

Figure 7:
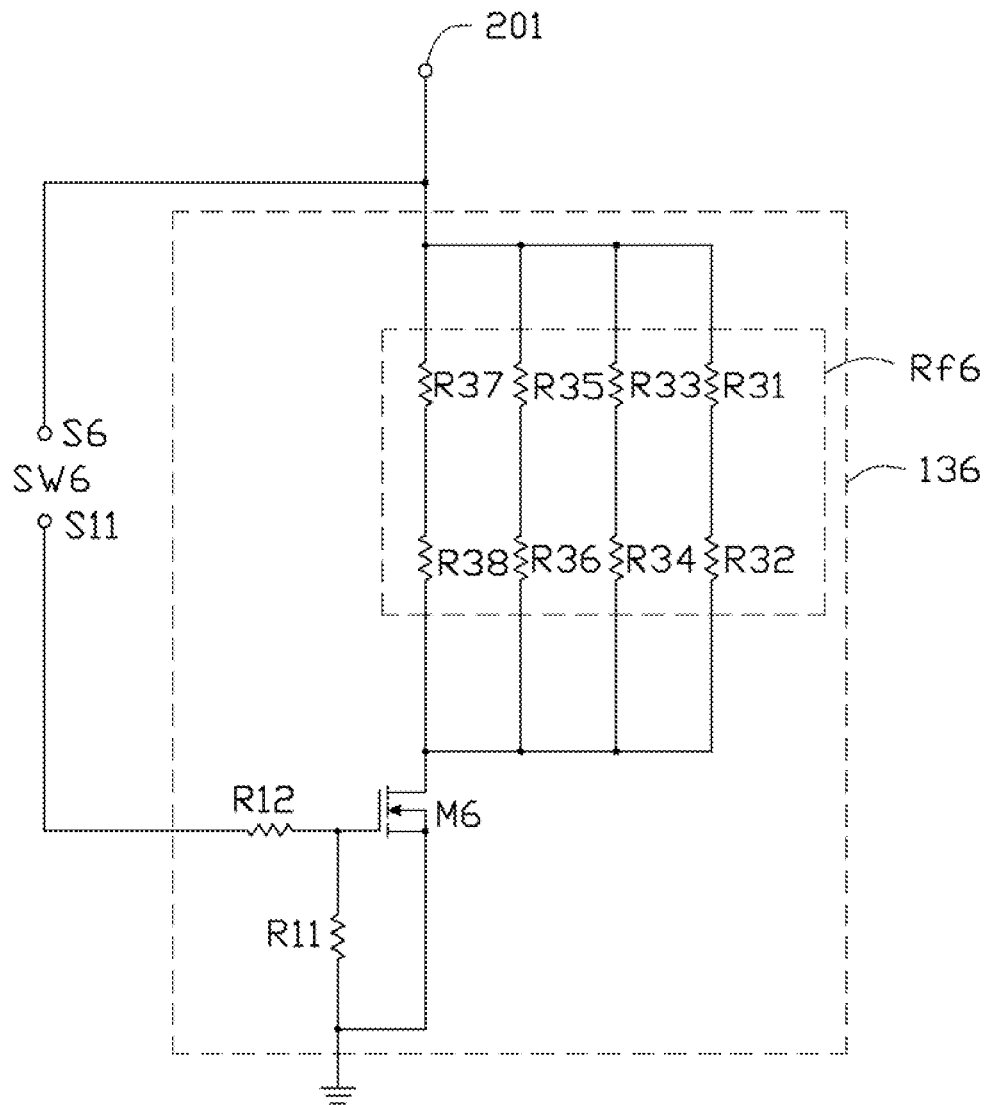
FIG. 7 is a circuit diagram of a sixth sub-circuit of the load circuit shown in FIG. 1, together with circuitry of the load circuit associated with the sixth sub-circuit.

Referring to FIG. 7, the sixth sub-circuit 136 includes a sixth resistance module Rf6, a sixth transistor M6, and resistors R11, R12. A terminal of the sixth resistance module Rf6 is connected to both the power terminal 201 and a terminal of the sixth switch SW6 (e.g., the sixth terminal S6). The other terminal of the sixth resistance module Rf6 is connected to a drain of the sixth transistor M6. A source of the sixth transistor M6 is connected to ground. A gate of the sixth transistor M6 is connected to ground via the resistor R11, and is also connected to the other terminal of the sixth switch SW6 (e.g., the eleventh terminal S11) through the resistor R12.

In this embodiment, the resistances of the first to sixth resistance modules Rf1-Rf6 are respectively about 50 ohms, 50 ohms, 35 ohms, 35 ohms, 10 ohms, and 7 and 1/7 ohms. In detail, the first resistance module Rf1 includes four resistors R13-R16 connected in series. The resistances of the four resistors R13-R16 are respectively about 15 ohms, 15 ohms, 10 ohms, and 10 ohms. The second resistance module Rf2 includes four resistors R17-R20 connected in series. The resistances of the four resistors R17-R20 are respectively about 15 ohms, 15 ohms, 10 ohms, and 10 ohms. The third resistance module Rf3 includes three resistors R21-R23 connected in series. The resistances of the three resistors R21-R23 are respectively about 10 ohms, 10 ohms, and 15 ohms. The fourth resistance module Rf4 includes three resistors R24-R26 connected in series. The resistances of the three resistors R24-R26 are respectively about 15 ohms, 10 ohms, and 10 ohms.

The fifth resistance module Rf5 includes four resistors R27-R30. The resistors R27-R28 are connected in series, and the resistors R29-R30 are separately connected in series. The two series of resistors, namely the resistors R27-R28 and the resistors R29-R30, are connected in parallel between the power terminal 201 and the drain of the fifth transistor M5. The resistances of the four resistors R27-R30 are all about 10 ohms. The sixth resistance module Rf6 includes eight resistors R31-R38. The resistors R31-R32 are connected in series, the resistors R33-R34 are separately connected in series, the resistors R35-R36 are separately connected in series, and the resistors R37-R38 are separately connected in series. The four series of resistors, namely the resistors R31-R32, the resistors R33-R34, the resistors R35-R36 and the resistors R37-R38, are connected in parallel between the power terminal 201 and the drain of the sixth transistor M6. The resistances of the eight resistors R31-R38 are respectively about 15 ohms, 10 ohms, 15 ohms, 10 ohms, 10 ohms, 10 ohms, 10 ohms, and 10 ohms.

When the first switch SW1 is turned on and the other switches SW2-SW8 are turned off, the power terminal 201 outputs a high level signal (e.g., logic 1) to the gate of the first transistor M1 through the first switch SW1, thereby driving the first transistor M1 to turn on. In this way, a current I1 flowing through the first resistance module Rf1 and the first transistor M1 is about $$\frac{Vcc}{Rf1} = \frac{5}{50} = 100 \text{ mA}.$$

Similarly, when the second switch SW2 is turned on and the other switches SW1 and SW3-SW8 are turned off, a current I2 flowing through the second resistance module Rf2 and the second transistor M2 is about 100 mA (milliamperes). When the third switch SW3 is turned on and the other switches SW1-SW2 and SW4-SW8 are turned off, a current I3 flowing through the third resistance module Rf3 and the third transistor M3 is about 150 mA. When the fourth switch SW4 is turned on and the other switches SW1-SW3 and SW5-SW8 are turned off, a current I4 flowing through the fourth resistance module Rf4 and the fourth transistor M4 is about 150 mA. When the fifth switch SW5 is turned on and the other switches SW1-SW4 and SW6-SW8 are turned off, a current I5 flowing through the fifth resistance module Rf5 and the fifth transistor M5 is about 500 mA. When the sixth switch SW6 is turned on and the other switches SW1-SW5 and SW7-SW8 are turned off, a current I6 flowing through the sixth resistance module Rf6 and the sixth transistor M6 is about 900 mA.

Referring to the table below, when one type of the USB port 200 is tested, a tester turns on one or a plurality of the first to sixth switches SW1-SW6, thereby connecting one or a plurality of the first to sixth sub-circuits 131-136 to the USB port 200. For example, when the first switch SW1 or the second switch SW2 is turned on, the current dividing circuit 13 consumes a load current of about 100 mA via the first sub-circuit 131 or the second sub-circuit 132 to simulate a minimum-standard load current for one USB port 200 of type 1.0, type 1.1, or type 2.0. When the first switch SW1 and the second switch SW2 are turned on, the current dividing circuit 13 consumes a load current of about 200 mA via both the first sub-circuit 131 and the second sub-circuit 132 to simulate a minimum-standard load current for two USB ports 200 of type 1.0, type 1.1, or type 2.0. When the third switch SW3 or the fourth switch SW4 is turned on, the current dividing circuit 13 consumes a load current of about 150 mA via the third sub-circuit 133 or the fourth sub-circuit 134 to simulate a minimum-standard load current for a USB port 200 of type 3.0. When the first to fourth switches SW1-SW4 are turned on, the current dividing circuit 13 consumes a load current of about 1000 mA via the first to fourth sub-circuits 131-134 to simulate a maximum-standard load current for two USB ports 200 of type 1.0, type 1.1, or type 2.0.

The table below sets out a relation between states of the switches and load currents:

| Type | Amount | Load current (mA) (Imin: a minimum-standard load current; Imax: a maximum-standard load current) | | States of the switches (1: on; 0: off) | | | | | |
|---|---|---|---|---|---|---|---|---|---|
| | | | | SW1 | SW2 | SW3 | SW4 | SW5 | SW6 |
| type 1.0, type 1.1, or type 2.0 | one | Imin | 100 | 1 | 0 | 0 | 0 | 0 | 0 |
| | | | | 0 | 1 | 0 | 0 | 0 | 0 |
| | | Imax | 500 | 1 | 1 | 1 | 1 | 0 | 0 |
| | two | Imin | 200 | 1 | 1 | 0 | 0 | 0 | 0 |
| | | Imax | 1000 | 1 | 1 | 1 | 1 | 1 | 0 |
| type 3.0 | one | Imin | 150 | 0 | 0 | 1 | 0 | 0 | 0 |
| | | | | 0 | 0 | 0 | 1 | 0 | 0 |
| | | Imax | 900 | 1 | 0 | 1 | 1 | 1 | 0 |
| | two | Imin | 300 | 0 | 0 | 1 | 1 | 0 | 0 |
| | | Imax | 1800 | 1 | 0 | 1 | 1 | 1 | 1 |

In use, when one type of the USB port 200 is tested, the tester turns on one or a plurality of the first to sixth switches SW1-SW6. In detail, when one USB port 200 of type 1.0, type 1.1, or type 2.0 is being tested, the first sub-circuit 131 or the second sub-circuit 132 is connected to the USB port 200 under test to consume a minimum-standard load current by means of turning on the first switch SW1 or the second switch SW2; and the first to fourth sub-circuits 131-134 are connected to the USB port 200 under test to consume a maximum-standard load current by means of turning on the first to fourth switches SW1-SW4. When two USB ports 200 of type 1.0, type 1.1, or type 2.0 are being tested, both the first sub-circuit 131 and the second sub-circuit 132 are connected to the USB ports 200 under test to consume a minimum-standard load current; and the first to fifth sub-circuits 131-135 are connected to the USB ports 200 under test to consume a maximum-standard load current.

When one USB port 200 of type 3.0 is being tested, the third sub-circuit 133 is connected to the USB port 200 under test to consume a minimum-standard load current; and the first sub-circuit 131 and the third to fifth sub-circuits 133-135 are all connected to the USB port 200 under test to consume a maximum-standard load current. When two USB ports 200 of type 3.0 are being tested, both the third sub-circuit 133 and the fourth sub-circuit 134 are connected to the USB ports 200 under test to consume a minimum-standard load current; and the first sub-circuit 131 and the third to sixth sub-circuits 133-136 are all connected to the USB ports 200 under test to consume a maximum-standard load current.

In other embodiments, the load circuit 100 further includes a malfunction indication circuit 15. The malfunction indication circuit 15 includes a light-emitting diode (LED) D1. An anode of the LED D1 is connected to the power terminal 201 through a resistor R39. A cathode of the LED D1 is connected to ground. When the power terminal 201 provides a normal voltage to the load circuit 100, the voltage is connected to ground via the resistor R39 and the LED D1, and the LED D1 is turned on. When the power terminal 201 is unable to output any voltage due to a malfunction, the LED D1 is off, as an indication to the user.

In other embodiments, the load circuit 100 further includes a function-testing circuit 17. The function-testing circuit 17 includes a control switch SW-PB. A terminal of the control switch SW-PB is connected to the power terminal 201 via the seventh switch S7, and the other terminal of the control switch SW-PB is connected to ground. The user can test the short-circuit performance of the load circuit 100 when the seventh switch S7 and the control switch SW-PB are both turned on.

In the present specification and claims, the word "a" or "an" preceding an element does not exclude the presence of a plurality of such elements. Further, the word "comprising" does not exclude the presence of elements or steps other than those listed.

It is to be also understood that even though numerous characteristics and advantages of exemplary embodiments have been set forth in the foregoing description, together with details of the structures and functions of the embodiments, the disclosure is illustrative only, and changes may be made in detail, especially in matters of arrangement of parts within the principles of this disclosure to the full extent indicated by the broad general meaning of the terms in which the appended claims are expressed.

What is claimed is:

1. A load circuit for simulating different standard load currents for different kinds of Universal Serial Bus (USB) ports, each of the USB ports comprising a power terminal; the load circuit comprising:
a switch unit comprising a plurality of switches; and
a current dividing circuit comprising a plurality of sub-circuits, each of the sub-circuits comprising a resistance module and a transistor, wherein a terminal of the resistance module of each of the sub-circuits is connected to both the power terminal and a terminal of a corresponding one of the switches, another terminal of the resistance module of each of the sub-circuits is connected to a drain of the transistor, a source of the transistor is connected to ground, and a gate of the transistor is connected to ground through a resistor and is also connected to another terminal of the corresponding switch through another resistor.

2. The load circuit of claim 1, further comprising a malfunction indication circuit, wherein the malfunction indication circuit comprises a light-emitting diode (LED), an anode of the LED is connected to the power terminal through a resistor, and a cathode of the LED is connected to ground.

3. The load circuit of claim 1, wherein the switch unit is a toggle switch, and comprises first to sixteenth terminals, the first terminal is electronically connectable to and disconnectable from the sixteenth terminal to form a first switch, the second terminal is electronically connectable to and disconnectable from the fifteenth terminal to form a second switch, the third terminal is electronically connectable to and disconnectable from the fourteenth terminal to form a third switch, the fourth terminal is electronically connectable to and disconnectable from the thirteenth terminal to form a fourth switch, the fifth terminal is electronically connectable to and disconnectable from the twelfth terminal to form a fifth switch, the sixth terminal is electronically connectable to and disconnectable from the eleventh terminal to form a sixth switch, the seventh terminal is electronically connectable to and disconnectable from the tenth terminal to form a seventh switch, and the eighth terminal is electronically connectable to and disconnectable from the ninth terminal to form an eighth switch.

4. The load circuit of claim 3, further comprising a function-testing circuit, wherein the function-testing circuit comprises a control switch, a terminal of the control switch is connected to the power terminal via the seventh switch, and another terminal of the control switch is connected to ground.

5. The load circuit of claim 3, wherein the eighth switch is idle.

6. The load circuit of claim 3, wherein the plurality of the sub-circuits comprises a first sub-circuit corresponding to the first switch, a second sub-circuit corresponding to the second switch, a third sub-circuit corresponding to the third switch, a fourth sub-circuit corresponding to the fourth switch, a fifth sub-circuit corresponding to the fifth switch, and a sixth sub-circuit corresponding to the sixth switch.

7. The load circuit of claim 6, wherein the resistance of the resistance module of the first sub-circuit is about 50 ohms.

8. The load circuit of claim 6, wherein the resistance of the resistance module of the second sub-circuit is about 50 ohms.

9. The load circuit of claim 6, wherein the resistance of the resistance module of the third sub-circuit is about 35 ohms.

10. The load circuit of claim 6, wherein the resistance of the resistance module of the fourth sub-circuit is about 35 ohms.

11. The load circuit of claim 6, wherein the resistance of the resistance module of the fifth sub-circuit is about 10 ohms.

12. The load circuit of claim 6, wherein the resistance of the resistance module of the sixth sub-circuit is about 7 and 1/7 ohms.

13. A load circuit, comprising:
a switch unit comprising a plurality of switches; and
a current dividing circuit comprising a plurality of sub-circuits;
wherein each of the sub-circuits is connectable to at least one Universal Serial Bus (USB) port and connected to a corresponding one of the switches;
each of the sub-circuits is configured to draw a respective load current from the at least one USB port when the sub-circuit is connected to the at least one USB port and the corresponding switch is turned on; and
when a selected one or a selected plurality of the switches is or are turned on, the corresponding one sub-circuit or corresponding plurality of sub-circuits is or are connected to the at least one USB port, and the corresponding one sub-circuit or corresponding plurality of sub-circuits draw a desired load current from the at least one USB port.

* * * * *